Nov. 14, 1967 C. J. MURCH, JR 3,352,730

METHOD OF MAKING MULTILAYER CIRCUIT BOARDS

Filed Aug. 24, 1964

CHARLES J. MURCH, JR.
*INVENTOR*

BY [signature]

United States Patent Office 3,352,730
Patented Nov. 14, 1967

3,352,730
METHOD OF MAKING MULTILAYER CIRCUIT BOARDS
Charles J. Murch, Jr., Reeds Ferry, N.H., assignor to Sanders Associates, Inc., Nashua, N.H., a corporation of Delaware
Filed Aug. 24, 1964, Ser. No. 391,510
9 Claims. (Cl. 156—3)

This invention relates to a multilayer circuit board and its method of manufacture. More particularly, this invention relates to a multilayer circuit board which has solid homogeneous circuit interconnections between layers of the board's insulation. In addition, the multilayer circuit board of this invention can take the form of a flexible board which can be mounted in or on a variety of different contoured surfaces.

The advancing technology present in the field of electronics has brought about an ever increasing need for compactness, rugged durability and the freedom to design multilayer circuitry capable of both hardboard construction and flexible mount construction. The efforts in the field of hardboard manufacture have brought about many innovations in the interconnecteion of different circuits mounted on the boards. These innovations have taken the form of plated through holes from circuit layer to layer and also the use of pins and eyelets soldered or fused in place. Other advances have also included techniques to grow pillar type circuit connectors or on the other hand, the etching away of relatively thick layers of metals to leave column-like elements that are utilized to interconnect layers of circuitry.

While these just noted techniques have specialized areas of usage, all are faced with either expensive or difficult process steps. In all the applications of circuit interconnectors where a hole must be bored entirely through the board, the circuit density capability of the board is limited. The aforementioned pillar or column techniques in one embodiment require costly multiple sanding steps brought about by the need to apply insulation layers in an uncured condition so as to insure their completely surrounding of each pillar or column.

The invention to be described, which utilizes a sheet of preinspected insulation material, can guarantee that nowhere in the finished multilayer circuitry will there appear any flaw-type discontinuities in the insulation between circuits. The column or pillar processes utilizing uncured insulation which reaches a semi-liquid state during curing require close control to prevent voids, gas bubbles and contamination which could result in dielectric value for the insulation which is unpredictable.

The invention to be described hereinafter provides multilayer circuitry which is free of all the process difficulties noted and is inherently more reliable, simpler and cheaper to produce in any quantity.

It is therefore an object of this invention to provide a readily fabricated multilayer circuitry that is capable of both hardboard and flexible board construction with the same process.

Another object of this invention is to provide a solid homogeneous circuit to circuit interconnection capable of being formed in one principal step of the process.

An yet another object of this invention is to provide a multilayer circuit board that is free of the need to punch, drill, or form openings through the board to provide circuit interconnections.

Another object of the invention is the ability to provide a high density circuit configuration without sacrificing overall circuit integrity.

Other objects of the invention will in part be obvious and will in part appear hereinafter.

The invention accordingly comprises the features of construction, combination of elements, and arrangement of parts which will be exemplified in the process and article hereinafter set forth, and the scope of the invention will be indicated in the claims.

For a fuller understanding of the nature and objects of the invention, reference should be had to the following detailed description taken in connection with the accompanying drawings, in which.

Figures 1, 2, 3, 4, 5, 6, 7:
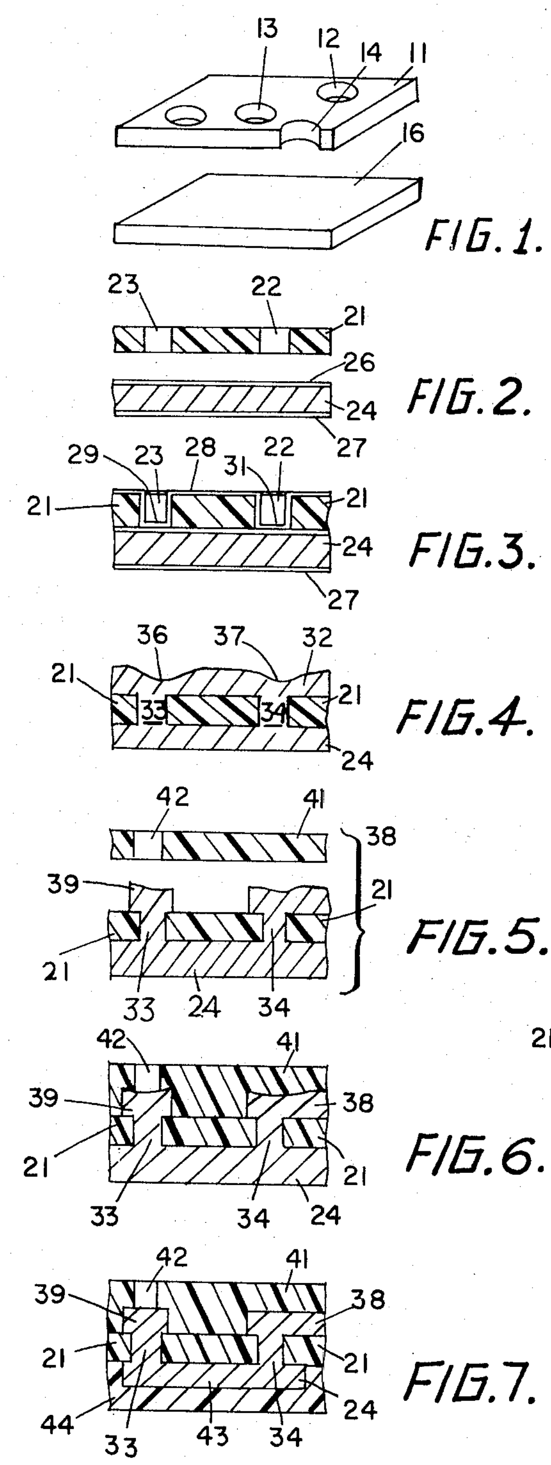
FIG. 1 depicts a layer of insulation material superimposed over a sheet of metallic foil.
FIG. 2 is a cross section of a typical layer of plastic and treated metallic foil.
FIG. 3 is a cross section of sensitized laminate of insulation and metallic foil.
FIG. 4 is a cross section of a multilayer laminate embodying the invention.
FIG. 5 is a cross section of an etched multilayer laminate embodying the invention.
FIG. 6 is a cross section of an encapsulated multilayer laminate embodying the invention.
FIG. 7 is a cross section of a multi-etched totally encapsulated multilayer laminate embodying the invention.

Referring now to FIG. 1, there is illustrated therein a layer of insulation material 11 superimposed over a sheet of metallic foil 16. In the layer of insulation material 11, there are holes 12, 13 and 14. This figure is set forth merely to show the materials involved and that the layer of insulation 11 and the metallic foil 16 occupy or can occupy a three dimensional planar region of any particular size depending on the application and the circuit sought to be produced.

Referring to FIG. 2, there is illustrated a cross section of a typical layer of plastic insulation 21, which plastic has holes 22 and 23 passing through the layer of plastic 21. These holes 22 and 23 may be formed by punching, drilling, stamping or even by chemical etching of the plastic material to produce the openings. These openings are so situated in the plastic so as to provide the open passageways for solid homogeneous circuit to circuit interconnections which will be described more fully hereafter.

Directly beneath the layer of insulation 21, a metallic foil sheet 24 is shown in cross section. Schematically indicated on either surface, top or bottom, of the metallic foil sheet 24 there is a representation of a treatment 26 and 27 to the surface of the foil. This treatment does not form a part of the invention and may be an adhesive to aid in the bonding of the metallic foil 24 to the insulation layer 21. The treatment to the surface 26 may take the form of cupric oxide as shown in the patent to Dahlgren, No. 2,997,521.

The surface treatment of the foil 24 will determine the manner in which the plastic layer 21 adheres to the foil 24. In the case of treatments of cupric oxide, heat and pressure will suffice to form the requisite bond to the metallic foil 24. In the case of adhesives, mere pressure may be all that is needed depending on the adhesive used.

Referring now to FIG. 3, there is illustrated the laminate formed by the pressing together of the layer of plastic 21 of FIG. 2 onto the metal foil 24. At this stage of the process, I shall designate some specific materials that could be used to make one form of the circuitry. For example, the layer of insulation 21 might take the form of a sheet of H film plastic which has a thin layer of Teflon on either side thereof to enhance its bondability to the copper or the metallic foil 24. The Teflon plastic is chemically a fluorinated ethylene and propylene and the H film is chemically a polyimide. Both Teflon and H film are trademarks of the Du Pont Company of Delaware. The selection of Teflon coated H film in the preferred embodiment produces certain advantages. It is to be understood of course that the invention is not limited to the use of any one thermoplastic or thermosetting plastic. Since the H film which is sandwiched between the Teflon has a higher melting temperature than the Teflon, the use of encapsulating cover coats to be described hereinafter may be applied with heat and pressure without the fear that the H film will soften while the cover coat is being bonded to the Teflon layer. The presence of the high melt temperature H film also permits the fabrication of the multilayer circuitry and the ability to dip the entire board in a molten bath of solder. The use of the multilayer insulation also provides dimensional stability to the entire layer of insulation, the dimensional stability being due to the inherent nature of the Teflon to shrink continuously especially when heated.

The metallic foil 24 may be either copper, nickel, or any other suitable conductor material that can be made into a foil sheet. It should be understood at this time that all the figures show the dimensions involved greatly exaggerated for purposes of illustrating and describing the invention. In fact, in practice, the layers involved are extremely thin. For example, the layer of plastic insulation material 21 is generally on the letter of .005 inch in thickness, and the metal foil is approximately .0005 to .010 inch.

Once the layer of plastic is bonded to the metallic foil, the entire surface of the plastic layer 21 is to be treated to form a treated surface 28, 29 and 31. Another innovation contemplated is the idea of selectively sensitizing the surface of the insulation to establish a circuit configuration which will later have a conductive material deposited thereon. Where cupric oxide or an adhesive is used, the surface of the foil at the bottom of the holes 22 and 23 must be cleaned of cupric oxide or adhesive. The cupric oxide may be removed with a solution of muriatic acid and the adhesive by any suitable solvent. All of the cupric oxide of surface 27 may be removed by this technique.

The sensitizing of the surface of the plastic and of the interior of the holes 22 and 23 is to enhance the next process step which is to be described and that process step is the deposition upon the sensitized surfaces 28, 29 and 31 of a suitable electrically conductive material. To sensitize the surface if the material is Teflon, a sodium fluobond solution is applied to etch the Teflon plastic. The Teflon can then be treated by the Shipley process which utilizes electroless copper solution such as 328 obtainable from the Shipley Company of Wellesley, Mass. This deposit, which forms the structure illustrated in FIG. 4, may alternatively be accomplished by vapor deposition, electrical plating or other suitable conventional techniques for depositing electrically conductive materials upon the sensitized surface of the plastic layer 21 described above.

With specific reference to FIG. 4, it will be seen that after the plating or depositing step has been completed, there is now present a deposited coating of electrically conductive material 32 which totally covers the entire layer of plastic material 21 and in so covering the entire layer 21, the material, that is the electrically conductive material, has totally covered the openings 22 and 23 and formed therein due to the sensitized nature of the surface of the opening, homogeneous solid connectors 33 and 34 which bond the deposited coating 32 to the layer of metallic foil 24.

As can be seen from this figure, dimples 36 and 37 appear on the surface of the deposited layer 32. The dimples have been greatly exaggerated for purposes of illustration. These dimples are present due to the even rate deposition of the material upon the sensitized surface of the plastic and the holes and since the rate of deposition is uniform, those areas where solid homogeneous electrical connections are to be formed inherently have these dimpled regions 36 and 37 present. These do not form any functional portion of the invention, but are merely inherent in the production of the layer of electrically conductive material 32. An alternative process which does not result in these dimples is described hereinafter.

FIG. 4 excludes the schematic showing of the sensitizing material for the surface of the plastic and the holes. At this stage of the process, I have two layers of metal bonded together or held together by solid homogeneous connectors 33 and 34 and between these metallic layers 32 and 24, I have interposed a layer of insulation material 21. The next process step involved utilizes basic photo etching techniques to produce upon the surface of the deposited metal conductive surface 32 a predetermined circuit configuration which will be obtained by treating the surface of the deposited layer 32 with a photo resist followed by a subsequent etching step to lead to (as is shown in FIG. 5), a circuit configuration exposed on the upper side of the plastic layer 21, or alternatively depositing copper only in the sensitized areas described heretofore. This circuit as schematically shown in FIG. 5 includes an electrical connection pad 39 and to the right of the figure an etched circuit portion 38.

At this point, this circuit could be utilized without the provision of any additional process steps for the electrical connection pad 39 could receive a lead bonded or fused to its face and the etched circuit portion 38 could be connected to another electrical component in the system.

To further enhance the multilayer circuitry depending upon the environmental conditions involved, an insulation cover coat 41 (which is shown superimposed in FIG. 5) may be pressed down upon the circuit configuration just noted and as is illustrated in FIG. 6, totally encapsulate the circuit exposed by the etching procedures just mentioned. The bond of the encapsulating layers may be enhanced by treating the metal circuit surfaces to be bonded with a suitable adhesive or roughening agent. In the case of copper, the formation of cupric oxide as described in the Dahlgren patent aforementioned may be employed.

To the left hand side of FIGS. 5 and 6, as well as FIG. 7, there is designated a hole 42, which hole forms a pad opening and this pad opening is needed to permit the electrical connection to the pad of circuit components sought to be integrated into the multilayer circuit board being described.

FIG. 7 actually describes or illustrates two process steps which produce a totally finished and encapsulated multilayer circuit board. As can be appreciated, the metallic foil 24 has been treated with a photo resist and a circuit configuration etched to produce the etched circuit interconnector 43 between the solid homogeneous connectors 33 and 34 to thereby provide an electrical connection from the tab 39 to the etched electrical circuit 38. Pressed down upon the etched circuit interconnector 43 is an insulation base encapsulating layer. This base layer of plastic material may be of a similar type to that of the layer 21, and may be applied in this instance by heat and pressure to bond the plastic and totally encapsulate the circuit configuration involved; or on the other hand; where suitable adhesives are available, the circuit connector 43 may be covered by an adhesive and then the encapsulating base layer plastic 44 may be pressed in place. It should be noted that the inclusion of either base encapsulating layer or a cover coating top layer of plastic such as 41 may or may not be necessary to produce a usable electrical circuit.

Figures 8, 9, 10, 11, 12:
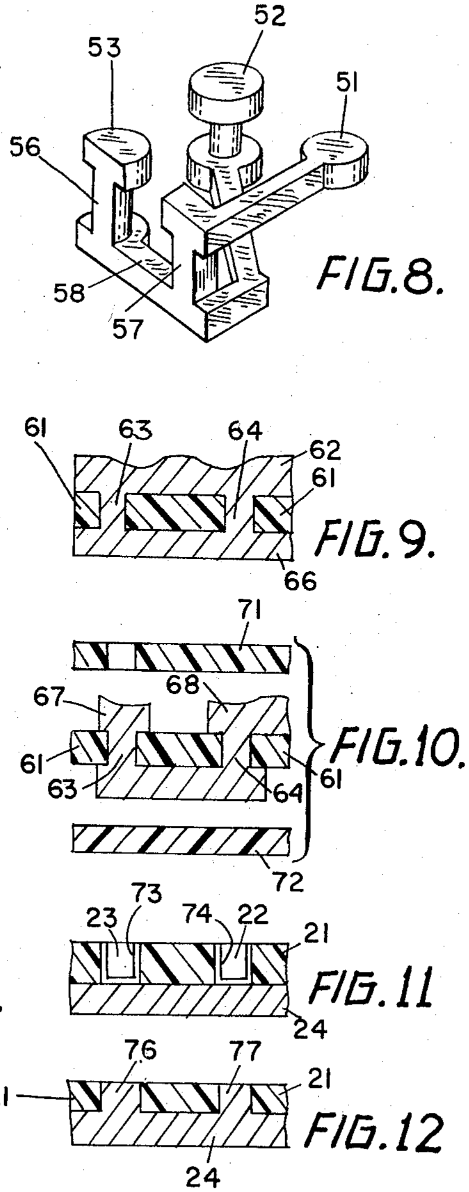
FIG. 8 is a three dimensional representation of one type conductor arrangement possible by utilizing the invention.
FIG. 9 is a cross section of a multilayer laminate embodying the invention which will be subjected to a variation in the etching process.
FIG. 10 is a cross section of a simultaneously etched multilayer arrangement prior to final encapsulation.
FIG. 11 is a cross section of a laminate of insulation and metallic foil with the openings in the insulation sensitized.
FIG. 12 is another embodiment of this invention depicting circuit connectors grown independently.

FIG. 8 sets forth a three dimensional representation of the type of circuit configuration capable with the process described to this point. It shows a number of electrical connector pads 51, 52 and 53 which have been created by the process just described. The electrical connector pads 53 and 51 are interconnected by homogeneous solid circuit connector 56 which in turn is electrically and mechanically connected to an etched circuit interconnection 58 and thence by a second homogeneous solid circuit connector 57 to the electrical connector pad 51.

FIG. 8 is set forth to illustrate one of the variations possible but is certainly not meant to be the only variation that this process is susceptible of producing. While to this point in the description there have been described but two metallic layers interconnected by the deposited interconnections, it is readily within the scope of this invention and the invention does contemplate in fact the addition of a subsequent interconnected circuit layer. This can be accomplished by merely prepunching or prelocating holes in the thermoplastic encapsulating cover layers and then depositing upon these layers additional electrically conductive materials followed by the screening on of circuit configurations of the predetermined nature, etching away these circuit configurations to form a third, fourth, or fifth layer as the process proceeds. It is required, however, in order to build multilayer circuits of any thickness and any number of layers, that the designer of the circuitry keep in mind that at each point at which he desires a solid homogeneous electrical interconnection between the circuits separated by plastic, he need only provide an opening which will be filled with a solid homogeneous deposit of electrically conductive material. These openings, as long as they appear one above the other in subsequent layers, will provide a solid homogeneous electrical interconnection from any base layer of metal to any intermediate deposited connector material all the way through to the circuit desired. It goes without saying in those areas where no circuit interconnection is desired, the mere presence of the plastic insulating material without a hole prevents this electrical interconnection.

Reference is now made to FIGS. 9 and 10 which illustrate a variation in the process described already. These figures are believed to set forth an additional embodiment of the invention which contemplates the mass production of multilayer circuitry where, for example, just two layers are sought to be fabricated. The description of FIGS. 9 and 10 of course is not meant to limit the process there described to just two layers, but is for purposes of illustration only. In actual use, any number of layers may be utilized in operating the processes set forth.

FIG. 9 depicts an arrangement of the same type as set forth in FIG. 4. Here a plastic insulating layer 61 has deposited thereon in the same manner taught by FIGS. 2–4, an electrically conductive layer 62 which has solid homogeneous interconnections 63 and 64 to the metallic foil sheet 66. This laminate may then be subjected to the photo etching technique described earlier; namely, the deposited layer 62 may have screened thereon a photo resist which describes the circuit configuration desired and at the same time, the layer of metallic coil 66 may have a circuit configuration screened on it. This laminate may then be placed into an etching solution and both circuit configurations that appear on either side of the insulation layer 61 may be etched simultaneously to produce in one process step what was described earlier in two process steps.

FIG. 10 illustrates the presence of two encapsulating cover layers 71 and 72 which may be pressed down upon the pad 67, the layer of plastic 61, and the etched circuit portion 68 to totally encapsulate the multilayer circuit in the manner shown in FIG. 7.

Reference is now made specifically to FIG. 11 where there has been set forth an arrangement in which the layer of plastic 21 has been bonded to a metallic foil sheet 24 much in the manner set forth in FIG. 3, but this embodiment of the invention contemplates that only the inner surfaces of the holes 22 and 23 be sensitized at 73 and 74. This will permit, when the next step in the process occurs, the depositing of the metallic electrically conductive material which will appear (as shown in FIG. 12), as solid homogeneous columns 76 and 77 which will provide a flush circuit interconnection for subsequent depositions or electrical connections to the flush deposited columns 76 and 77. The process is then carried on as described heretofore to produce a circuit free of the dimples or depression.

It will thus be seen that the objects set forth above, among those made apparent from the preceding description, are efficiently attained and, since certain changes may be made in the above article and process without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. The method of making a multilayer circuit board comprising the steps of:

bonding a layer of insulation material to a sheet of metallic foil, said layer having at least one opening therethrough, depositing a coating of electrically conductive material on said layer of insulation to thereby totally cover and fill said opening and totally cover said layer of insulation whereby a layer of said multilayer circuit board and a solid homogeneous interconnection between said deposited coating and said sheet of metallic foil are formed in a single step, and etching a circuit configuration in said coating of electrically conductive material, whereby said etched circuit is electrically and mechanically interconnected by a solid homogeneous interconnection to said sheet of metallic foil.

2. The method set forth in claim 1 which includes the step of etching a second circuit configuration in said sheet of metallic foil to thereby complete the fabrication of a multilayer circuit board having two circuits electrically and mechanically interconnected by a solid homogeneous interconnection through said opening in said insulation.

3. The method set forth in claim 2 wherein, said first and second circuit configurations are simultaneously etched in said deposited coating and said sheet of metallic foil.

4. The method set forth in claim 1 wherein, said insulation material is composed of a high melt temperature material integrally bonded to and interposed between two layers of material having a relatively lower melt temperature.

5. The method set forth in claim 1 which includes the step of sensitizing the surface of said insulating layer and said opening therein to enhance said surface's capacity to receive a subsequent coating.

6. The method set forth in claim 5 wherein, only the interior of said opening and the portion of said metallic foil exposed by said opening are sensitized.

7. The method set forth in claim 1 which includes the step of encapsulating said etched circuit configuration with a layer of insulating material.

8. The method set forth in claim 2 which includes the step of simultaneously encapsulating both sides of said multilayer circuit board in insulating material.

9. The method set forth in claim 5, wherein, only said circuit configuration pattern and said opening are sensitized to enhance said insulation's capacity to receive a subsequent coating.

References Cited

UNITED STATES PATENTS

| | | | |
|---|---|---|---|
| 2,864,156 | 12/1958 | Cardy | 29—155.5 |
| 3,099,608 | 7/1963 | Radovsky et al. | 204—15 |
| 3,264,402 | 8/1966 | Shaheen et al. | 174—68.5 |

FOREIGN PATENTS

| | | |
|---|---|---|
| 1,015,827 | 1/1966 | Great Britain. |
| 1,345,163 | 10/1963 | France. |

JACOB H. STEINBERG, *Primary Examiner.*